United States Patent
Ji et al.

(10) Patent No.: US 7,474,934 B2
(45) Date of Patent: Jan. 6, 2009

(54) METHODS AND APPARATUS FOR ENHANCING ELECTRONIC DEVICE MANUFACTURING THROUGHPUT

(75) Inventors: Hongbin Ji, San Jose, CA (US); James Hoffman, San Jose, CA (US); Inchen Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/179,777

(22) Filed: Jul. 12, 2005

(65) Prior Publication Data

US 2006/0009871 A1    Jan. 12, 2006

Related U.S. Application Data

(60) Provisional application No. 60/587,107, filed on Jul. 12, 2004.

(51) Int. Cl.
*G06F 19/00* (2006.01)
(52) U.S. Cl. ........................ 700/112; 700/121; 700/108
(58) Field of Classification Search ................. 700/108, 700/109, 110, 112, 111, 160, 175, 176, 178, 700/179, 213, 214, 223, 121
See application file for complete search history.

(56) References Cited

U.S. PATENT DOCUMENTS

| | | | | |
|---|---|---|---|---|
| 5,382,127 A | * | 1/1995 | Garric et al. ............. 414/217.1 |
| 6,157,866 A | * | 12/2000 | Conboy et al. ............... 700/121 |
| 6,287,386 B1 | * | 9/2001 | Perlov et al. ................. 118/719 |
| 6,336,204 B1 | * | 1/2002 | Jevtic ............................. 716/1 |
| 6,411,859 B1 | * | 6/2002 | Conboy et al. ............... 700/101 |
| 6,468,353 B1 | * | 10/2002 | Perlov et al. ................. 118/724 |
| 6,540,466 B2 | * | 4/2003 | Bachrach ..................... 414/217 |
| 6,594,599 B1 | * | 7/2003 | Kent et al. ..................... 702/84 |
| 6,654,698 B2 | * | 11/2003 | Nulman ........................ 702/85 |
| 7,065,725 B2 | * | 6/2006 | Yajima et al. .................. 716/4 |
| 2002/0035447 A1 | * | 3/2002 | Takahashi et al. ........... 702/188 |
| 2003/0171836 A1 | * | 9/2003 | Yajima et al. ............... 700/108 |
| 2005/0209721 A1 | * | 9/2005 | Teferra et al. ............... 700/100 |
| 2006/0190120 A1 | * | 8/2006 | Yajima et al. ............... 700/121 |

OTHER PUBLICATIONS

Wikipedia definition for "maintenance repair and operations".*

* cited by examiner

*Primary Examiner*—Albert DeCady
*Assistant Examiner*—Sunray R Chang
(74) *Attorney, Agent, or Firm*—Dugan & Dugan PC

(57) ABSTRACT

Methods, systems, and apparatus are provided that include determining a number of storage locations corresponding to busy chambers of an electronic device manufacturing tool; based on the number of storage locations corresponding to busy chambers, determining whether the electronic device manufacturing tool may accommodate a substrate; and of the electronic device manufacturing tool may accommodate a substrate, receiving a substrate in the electronic device manufacturing tool. Numerous other aspects are provided.

27 Claims, 6 Drawing Sheets

METHODS AND APPARATUS FOR ENHANCING ELECTRONIC DEVICE MANUFACTURING THROUGHPUT

The present application claims priority from U.S. Provisional Patent Application Ser. No. 60/587,107, filed Jul. 12, 2004, which is hereby incorporated by reference herein in its entirety.

FIELD OF THE INVENTION

The present invention relates generally to electronic device manufacturing, and more particularly to methods and apparatus for enhancing electronic device manufacturing throughput.

BACKGROUND

An algorithm may be employed to limit a number of substrates in an electronic device manufacturing tool during electronic device manufacturing (e.g., flat panel display and/or semiconductor device manufacturing). One conventional algorithm considers a number of slots corresponding to service chambers (e.g., load lock chambers, heating chambers, etc.) included in the electronic device manufacturing tool and a customer-specific offset, which is based on the customer's electronic device manufacturing tool topology. Such an algorithm does not adapt to a change in the electronic device manufacturing tool configuration, for example, due to a processing chamber fault during electronic device manufacturing. Consequently, such an algorithm may not efficiently limit the number of substrates in an electronic device manufacturing tool during electronic device manufacturing. As a result, dead locks and/or bottlenecks (e.g., jams), which adversely affect electronic device manufacturing throughput, may occur during electronic device manufacturing. Accordingly, methods and apparatus are desired for enhancing electronic device manufacturing throughput.

SUMMARY OF THE INVENTION

In a first aspect of the invention, a first method is provided for enhancing electronic device manufacturing throughput. The first method includes the steps of (1) determining a number of storage locations corresponding to busy chambers of an electronic device manufacturing tool; (2) based on the number of storage locations corresponding to busy chambers, determining whether the electronic device manufacturing tool may accommodate a substrate; and (3) if the electronic device manufacturing tool may accommodate the substrate, receiving the substrate in the electronic device manufacturing tool.

In a second aspect of the invention, a second method is provided for enhancing electronic device manufacturing throughput. The second method includes the steps of (1) determining a remaining maintenance time for each of a plurality of processing chambers of an electronic device manufacturing tool that is undergoing maintenance; (2) based on a remaining maintenance time of one of the plurality of processing chambers, determining whether the electronic device manufacturing tool may accommodate a substrate; and (3) if the electronic device manufacturing tool may accommodate the substrate, receiving the substrate in the electronic device manufacturing tool.

In a third aspect of the invention, a third method is provided for enhancing electronic device manufacturing throughput. The third method includes the steps of (1) determining a number of storage locations corresponding to busy chambers of an electronic device manufacturing tool; (2) determining a remaining maintenance time for each of a plurality of processing chambers of the electronic device manufacturing tool that is undergoing maintenance; (3) based on the number of storage locations corresponding to busy chambers and a remaining maintenance time of one of the plurality of processing chambers, determining whether the electronic device manufacturing tool may accommodate a substrate; and (4) if the electronic device manufacturing tool may accommodate the substrate, receiving the substrate in the electronic device manufacturing tool. Numerous other aspects are provided, as are methods, systems, apparatus and computer program products in accordance with these other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

Figure 1A:
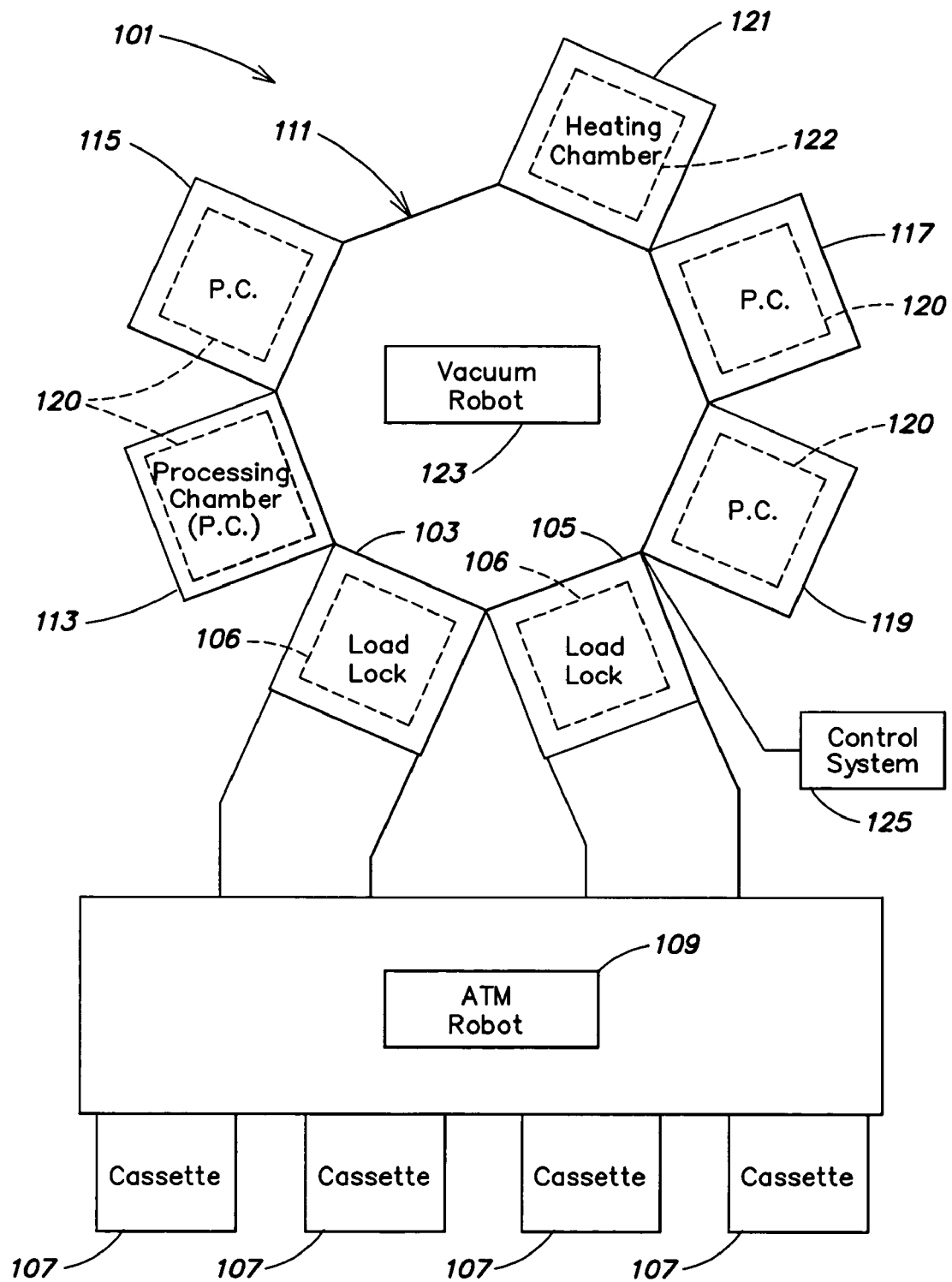
FIG. 1A illustrates a top view of a first exemplary electronic device manufacturing tool in accordance with an embodiment of the invention.

The present invention relates to enhancing electronic device manufacturing throughput by employing an algorithm for dynamically limiting a number of substrates that may be received by an electronic device manufacturing tool during electronic device manufacturing. The algorithm may determine whether an electronic device manufacturing tool may accommodate a substrate. In one embodiment, such determination is made based on a number of storage locations corresponding to busy chambers of the electronic device manufacturing tool. In another embodiment, such determination is made based on a remaining maintenance time of a processing chamber of the electronic device manufacturing tool. In yet another embodiment, such determination is made based on a number of storage locations corresponding to busy chambers of the electronic device manufacturing tool and a remaining maintenance time of a processing chamber of the electronic device manufacturing tool. Such embodiments are described below with reference to FIGS. 1A-4B.

Relevant Terminology

A mainframe refers to any heating chambers, processing chambers, transfer chambers, load lock chambers, vacuum robots, etc., of an electronic device manufacturing tool.

A customer-specific offset refers to an offset that allows electronic device manufacturing software to adapt to a customer's electronic device manufacturing tool configuration. A number of substrates allowed in the customer's electronic device manufacturing tool may be based, in part, on the customer-specific offset.

A processing chamber refers to a chamber that is adapted to perform a deposition process, an etching process or another similar process for affecting one or more material layer of a substrate. A processing chamber does not include a heating chamber. Remaining maintenance time refers to a time required to finish maintenance on a processing chamber, such as a time required to finish chamber cleaning.

A service chamber refers to a heating chamber, a load lock chamber or similar chamber.

A storage location refers to a location of a processing or service chamber that is adapted to receive a substrate, such as a chamber slot, a storage shelf or the like.

A busy chamber refers to any processing or service chamber of an electronic device manufacturing tool that has faulted or is offline, or a processing chamber of the electronic device manufacturing tool that is undergoing maintenance.

Atmospheric (ATM) robot substrate transfer time refers to a time required by an ATM robot to transport a substrate between a load lock chamber of an electronic device manufacturing tool and a cassette operatively coupled to the load lock chamber.

Load lock chamber substrate loading time refers to a time required to load (e.g., store) a substrate in a load lock chamber.

The load lock chamber loading time refers to the time required to close the I/O door and pump the load lock chamber to a desired vacuum pressure. The time required to unload the load lock chamber is referred to as the load lock chamber unloading time. The load lock chamber unloading time includes the time required to vent the load lock chamber to atmospheric pressure and open the I/O door.

Vacuum robot substrate transfer time refers to a time required by a vacuum robot to transfer a substrate between a load lock chamber and a processing chamber, between a load lock chamber and a heat chamber, or between a heat chamber and a processing chamber.

Exemplary System for Enhancing Electronic Device Manufacturing Throughput

FIG. 1A illustrates a top view of a first exemplary electronic device manufacturing tool 101 in accordance with an embodiment of the invention. With reference to FIG. 1A, the first exemplary electronic device manufacturing tool 101 includes one or more load lock chambers 103-105 for transporting a substrate (e.g., a glass substrate, a polymer substrate, a semiconductor wafer, etc.) between ambient pressure and a desired (vacuum) pressure. Each load lock chamber 103-105 includes one or more load lock chamber slots 106 (shown in phantom) for receiving a substrate. Load lock chambers 103-105 having a plurality of slots 106 may store more than one substrate at a time.

The time required to load the load lock chamber 103-105 is referred to as the load lock chamber loading time. The load lock chamber loading time includes the time required to close the I/O door and pump the load lock chamber to a desired vacuum pressure. The time required to unload the load lock chamber 103-105 is referred to as the load lock chamber unloading time. The load lock chamber unloading time includes the time required to vent the load lock chamber to atmospheric pressure and open the I/O door.

The one or more load lock chambers 103-105 are operatively coupled via an atmospheric (ATM) robot 109 to one or more cassettes 107 for storing new and/or processed substrates. The ATM robot 109 transports substrates between the one or more load lock chambers 103-105 and the one or more cassettes 107. A time required by the ATM robot 109 to transport a substrate between a load lock chamber 103-105 and a cassette 107 is referred to as the ATM robot substrate transfer time. The ATM robot 109 may be adapted to transport a single substrate or multiple substrates (e.g., 2 or more substrates).

The first exemplary electronic device manufacturing tool 101 includes a transfer chamber 111 coupled to the one or more load lock chambers 103-105. The transfer chamber 111 is also coupled to a plurality of processing chambers 113-119, and may be coupled to one or more additional chambers (e.g., a heating chamber 121) of the electronic device manufacturing tool 101. Each processing chamber 113-119 may require a processing time to process a substrate and a maintenance time, such as a process clean time (e.g., a periodic maintenance (PM) cleaning recipe time) to clean the processing chamber. For example, for a chemical vapor deposition (CVD) process, the processing time for a processing chamber 113-119 may be 90, 120 or 160 seconds and the maintenance (e.g., process clean) time for the processing chamber 113-119 may be 300, 400, 500, 600, 700 or 800 seconds. Other values may be employed for the processing time and/or process clean time. The processing chambers 113-119 are cleaned based on a cleaning cycle specific to the electronic device manufacturing tool 101. For example, in one embodiment, a processing chamber 113-119 may process nine substrates before the processing chamber 113-119 is cleaned. The processing chamber 113-119 may undergo cleaning more or less frequently.

Each processing chamber 113-119 may include one or more processing chamber storage locations (e.g., slots) 120. The processing chambers 113-119 having more than one slot may receive more than one substrate at a time. Similarly, any additional chamber, such as the heating chamber 121, may include one or more additional chamber storage locations (e.g., slots) 122. The load lock chambers 103-105, the heating chamber 121 and the like are referred to as service chambers.

The transfer chamber 111 includes a vacuum robot 123, which includes one or more robot arms (not shown), for transporting a substrate among the one or more load lock chambers 103-105, the processing chambers 113-119, and one or more additional chambers (e.g., heating chamber 121). The time required by the vacuum robot 123 to transfer a substrate between a load lock chamber 103-105 and a chamber (e.g., processing chamber 113-119 or an additional chamber) is referred to as the vacuum robot substrate transfer time. The vacuum robot 123 may be adapted to transport a single substrate or multiple substrates (e.g., 2 or more substrates). The load lock chambers 103-105, transfer chamber 111, processing chambers 113-119, vacuum robot 123 and any additional chambers employed by the tool 101 (e.g., heating chamber 121) may be referred to as the mainframe of the electronic device manufacturing tool 101.

Note that the electronic device manufacturing tool 101 may include a larger or smaller number of load lock chambers 103-105, processing chambers 113-119, and/or additional chambers. For each electronic device manufacturing tool configuration, a user (e.g., customer) may specify a customer-specific offset (e.g., a router equipment constant (EC) limit offset), which indicates a maximum number of substrates allowed in the electronic device manufacturing tool at one time and enables software (e.g., router software) to adapt to a customer's electronic device manufacturing tool 101. However, in conventional systems, such an offset assumes all chambers of the electronic device manufacturing tool are active, which may be problematic when a chamber of the electronic device manufacturing tool is offline or faults or a processing chamber 113-119 of the electronic device manufacturing tool 101 undergoes maintenance.

The first exemplary electronic device manufacturing tool 101 includes a control system 125 coupled to one or more components of the mainframe. The control system 125 may include one or more microprocessors, microcontrollers and/or computer program products for controlling operation of one or more components of the first exemplary electronic device manufacturing tool 101. As described further below, in at least one embodiment of the invention, the control system 125 is adapted to dynamically limit the number of substrates that may be received by the electronic device manufacturing tool 101. For example, the control system 125 may execute software for dynamically limiting the number of substrates that may be received by the electronic device manufacturing tool.

The control system 125 may periodically determine (e.g., detect) the status of the electronic device manufacturing tool 101. In one embodiment, the control system 125 may determine the status of the electronic device manufacturing tool 101 once every 8 seconds. (although, a larger or smaller time interval may be employed). Additionally or alternatively, the control system 125 may determine the status of the electronic device manufacturing tool 101 in response to a trigger event. A trigger event may include, for example, completion of a substrate transfer, completion of a manufacturing process (e.g., a substrate processing or maintenance process), or the like. The status of the electronic device manufacturing tool 101 may include determining the status of chambers in the electronic device manufacturing tool 101 (e.g., active, in use, inactive due to cleaning or maintenance, etc.) and/or determining a number of substrates currently in the mainframe of the electronic device manufacturing tool 101. For example, the control system 125 may determine a number of chambers of the electronic device manufacturing tool 101 that are currently busy. A chamber may be busy if a chamber fault occurred, if the chamber (e.g., processing chamber 113-119) is undergoing maintenance (e.g., cleaning), or if the customer decides not to employ the chamber (e.g., to keep the chamber offline) during electronic device manufacturing.

Figure 1B:
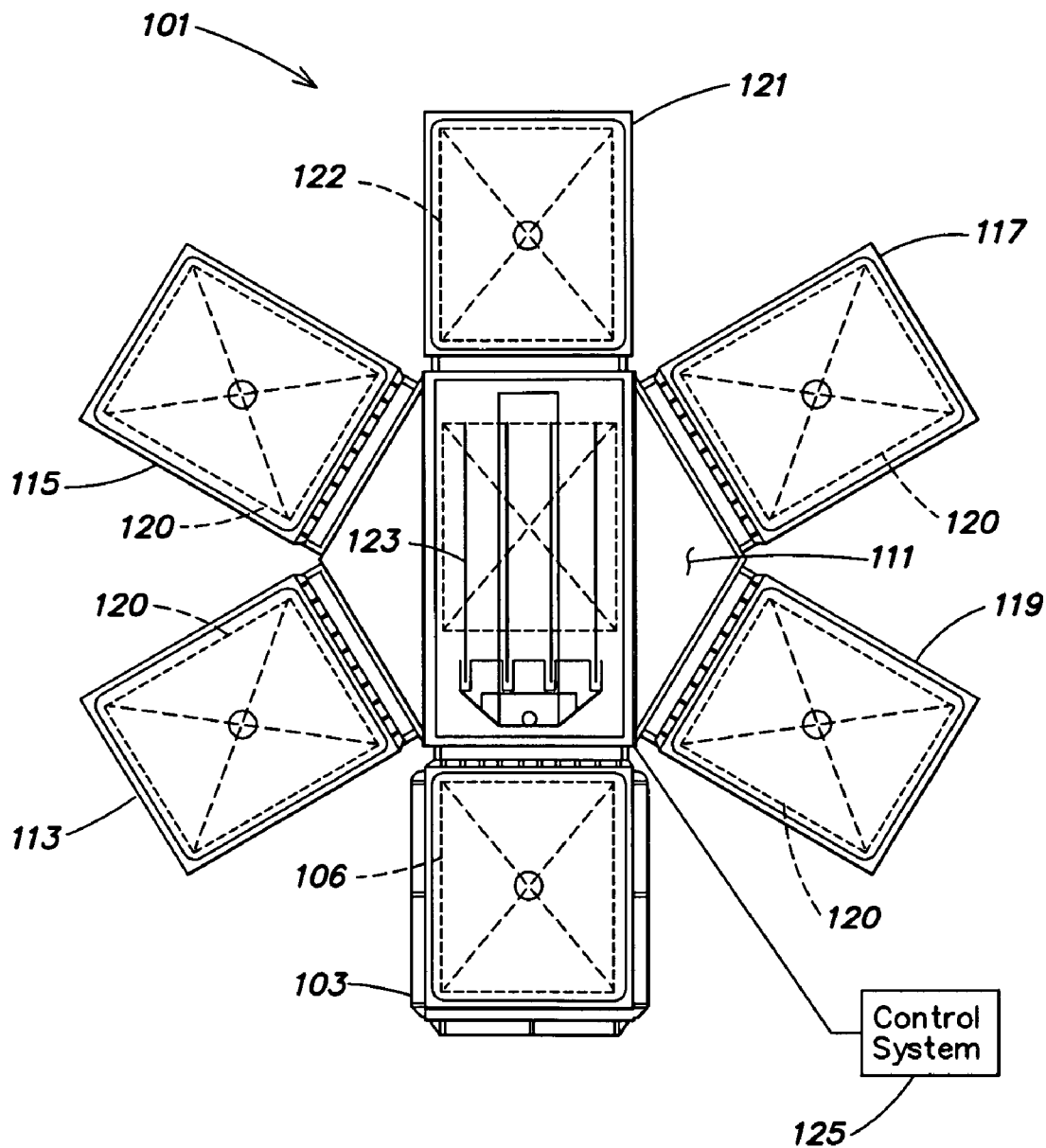
FIG. 1B illustrates a top view of an alternative embodiment for the first exemplary electronic device manufacturing tool of FIG. 1A.

FIG. 1B illustrates a top view of an alternative embodiment for the first exemplary electronic device manufacturing tool 101 of FIG. 1A. The electronic device manufacturing tool 101 of FIG. 1B is similar to that of FIG. 1A, but includes one, stacked load lock system 103 (e.g., three stacked, single substrate load lock chambers or any other suitable load lock chamber system) and a transfer chamber 111 that includes five sides (rather than eight as shown in FIG. 1A). Other numbers of load lock chambers and/or transfer chamber sizes may be used. For convenience, the robot 109, factory interface and cassettes 107 are not shown in FIG. 1B (but may be similar to those of FIG. 1A or any other suitable robot, factory interface and/or cassette).

Exemplary operation of the electronic device manufacturing tool 101 is now described with reference to FIGS. 2-4B.

Figure 2:
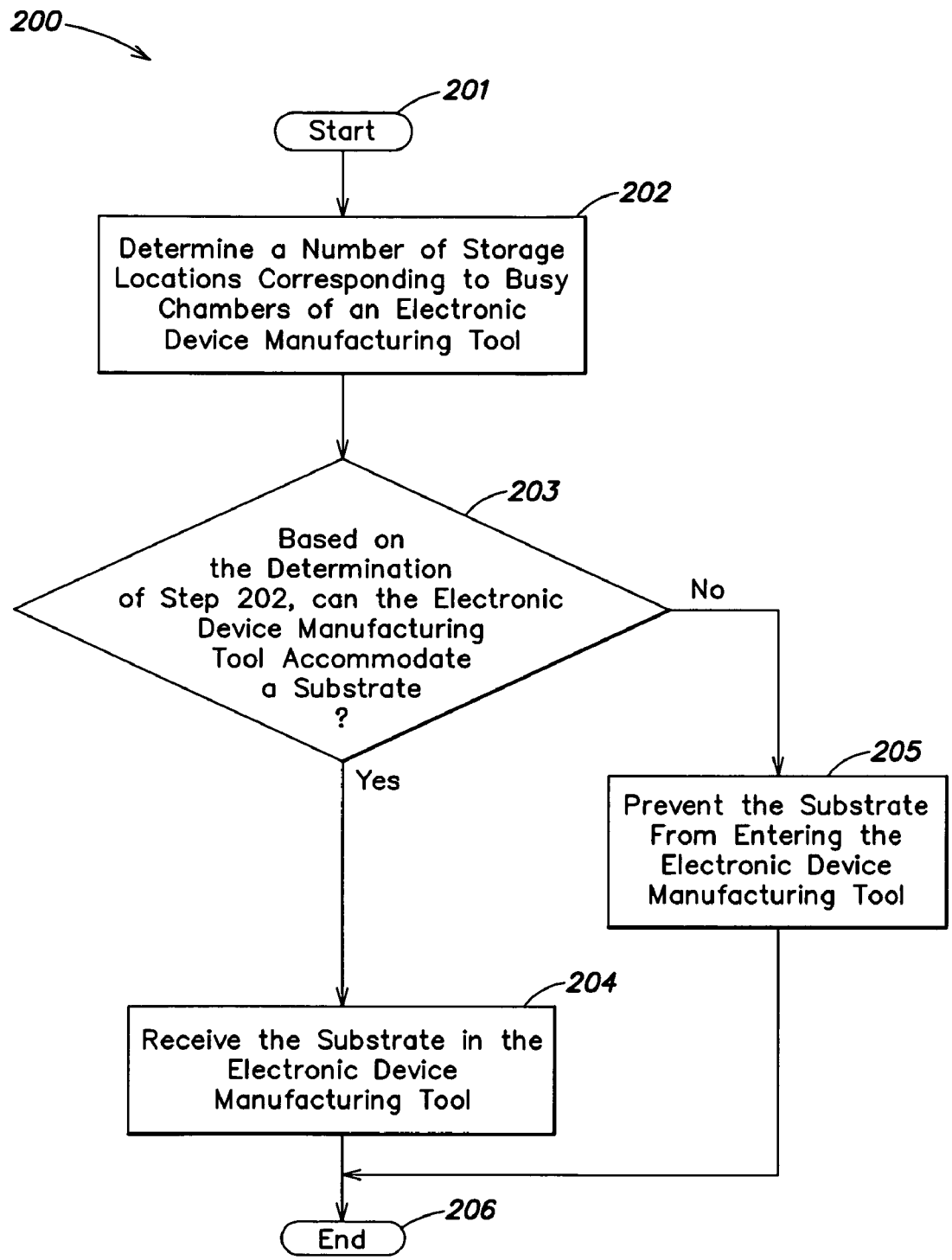
FIG. 2 illustrates a first exemplary method for enhancing electronic device manufacturing throughput in accordance with an embodiment of the invention.

First Exemplary Method for Enhancing Electronic Device Manufacturing Throughput FIG. 2 is a flowchart of a first exemplary method 200 for enhancing electronic device manufacturing throughput in accordance with an embodiment of the invention. One or more of the steps of method 200 may be implemented as one or more computer program products, and may be executed, for example, via the control system 125.

With reference to FIG. 2, the method 200 begins with step 201. In step 202, the number of storage locations corresponding to busy chambers of an electronic device manufacturing tool is determined. For example, when the electronic device manufacturing tool 101 is initially configured, the control system 125 may be provided with information regarding the number of storage locations present in each load lock chamber 103-105 (e.g., the number of slots 106), in each processing chamber 113-119 (e.g., the number of slots 120) and in the heating chamber 121 (e.g., the number of slots 122), or other initial configuration information. The total number of storage locations present in the electronic device manufacturing tool 101, as well as the number of storage locations associated with each load lock chamber 103-105, processing chamber 113-119 and the heating chamber 121, thus is a known, fixed quantity.

As stated previously, the control system 125 may monitor the status of the load lock chambers 103-105, the processing chambers 113-115 and the heating chamber 121. Accordingly, the control system 125 may determine whether any of the load lock chambers 103-105, processing chambers 113-119 or the heating chamber 121 are busy. A load lock chamber 103-105, heating chamber 121 or processing chamber may be busy if such chamber is offline or faulted. Further, a processing chamber 113-119 may be busy if the processing chamber 113-119 is undergoing maintenance (e.g., periodic or other cleaning or maintenance). Once the control system 125 determines which, if any, of the load lock chambers 103-105, the processing chambers 113-119 and the heating chamber 121 are busy, the control system 125 may employ its initial configuration information to determine the total number of storage locations (e.g., slots) associated with the busy chambers.

In step 203, based on the number of storage locations corresponding to busy chambers (determined in step 202), a determination is made as to whether the electronic device manufacturing tool may accommodate a substrate. For example, the control system 125 may compare the total number of substrates in the electronic device manufacturing tool 101 (e.g., in a mainframe of the tool 101) to the number of storage locations corresponding to busy chambers when making this determination. In one particular embodiment, the control system 125 compares the total number of substrates in the electronic device manufacturing tool 101 to the total number of service chamber storage locations in the electronic device manufacturing tool 101 (plus any customer-specific offset) minus the number of storage locations corresponding to busy chambers when making this determination (as described below in more detail with reference to FIGS. 4A-B). Other methods for determining whether the electronic device manufacturing tool may accommodate a substrate (based on the number of storage locations corresponding to busy chambers) also may be used. For example, in another particular embodiment, the control system 125 determines whether the total number of substrates in the electronic device manufacturing tool 101 is greater than or equal to the total number of service chamber storage locations in the electronic device manufacturing tool 101 (plus any customer-specific offset) minus the number of storage locations corresponding to busy chambers when determining whether the electronic device manufacturing tool 101 may accommodate a substrate.

If in step 203 it is determined that the electronic device manufacturing tool 101 may accommodate a substrate, the method 200 proceeds to step 204 wherein the substrate is received by the electronic device manufacturing tool 101. For example, the control system 125 may allow the load lock chamber 103 or load lock chamber 105 to receive a substrate from the ATM robot 109.

If, however, in step 203 it is determined that the electronic device manufacturing tool 101 may not accommodate a substrate, the method 200 proceeds to step 205 wherein the substrate is prevented from entering the electronic device manufacturing tool 101. For example, the control system 125 may prevent the load lock chamber 103 or load lock chamber 105 from receiving a substrate from the ATM robot 109. Following either steps 204 or 205, the method 200 ends in step 206.

Figure 3:
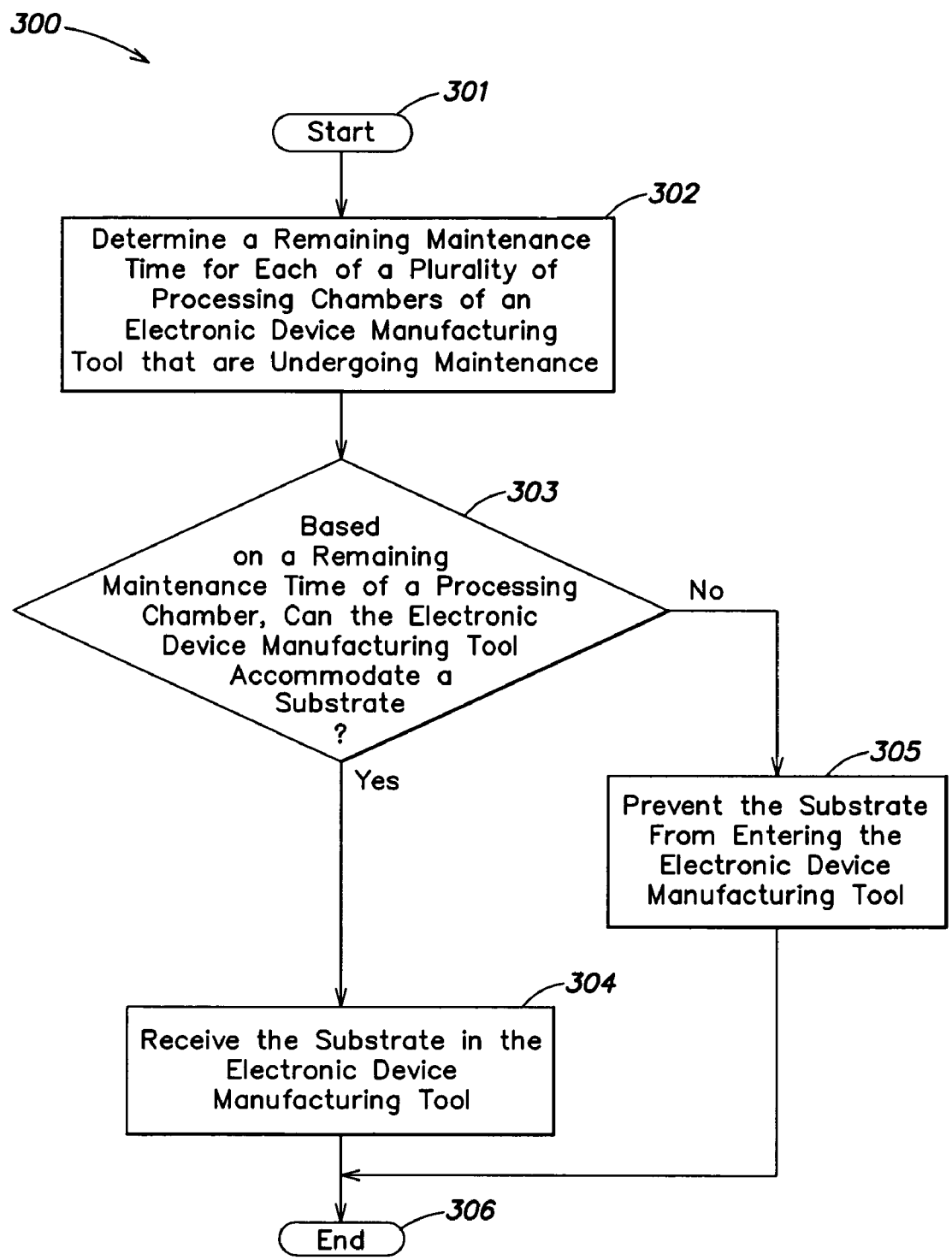
FIG. 3 illustrates a second exemplary method for enhancing electronic device manufacturing throughput in accordance with an embodiment of the invention.

Second Exemplary Method for Enhancing Electronic Device Manufacturing Throughput FIG. 3 is a flowchart of a second exemplary method 300 for enhancing electronic device manufacturing throughput in accordance with an embodiment of the invention. One or more of the steps of the method 300 may be implemented as one or more computer program products, and may be executed, for example, via the control system 125.

With reference to FIG. 3, the method 300 begins with step 301. As stated previously, the control system 125 may monitor the status of the load lock chambers 103-105, the processing chambers 113-119 and the heating chamber 121. Accordingly, the control system 125 may determine whether any of the processing chambers 113-115 are undergoing maintenance, such as a periodic cleaning, as well as the time remaining for such maintenance. More specifically, in step 302, a remaining maintenance time for each of a plurality of processing chambers of the semiconductor manufacturing tool that are undergoing maintenance is determined, for example, by the control system 125.

In step 303, based on a remaining maintenance time of a processing chamber, a determination is made as to whether the electronic device manufacturing tool may accommodate a substrate. For example, the control system 125 may compare the remaining maintenance time of one of the plurality of processing chambers 113-119 undergoing maintenance to the time required to transfer a substrate from a cassette 107 to the processing chamber when making this determination. In one particular embodiment, when making this determination the control system 125 compares the remaining maintenance time of a processing chamber (e.g., the processing chamber that has the smallest remaining maintenance time) to the sum of (1) the time required by the ATM robot 109 to transport a substrate from a cassette 107 to one of the load lock chambers 103-105 (ATM_XFER); (2) the time required to load the substrate into one of the load lock chambers 103-105 (LT); and (3) the time required by the vacuum robot 123 to transport the substrate from the respective load lock chamber 103-105 to the processing chamber (VAC_XFER) (as described below in more detail with reference to FIGS. 4A-B). Other methods for determining whether the electronic device manufacturing tool 101 may accommodate a substrate (based on a remaining maintenance time of a processing chamber) also may be used. For example, in another particular embodiment, when determining whether the electronic device manufacturing tool 101 may accommodate a substrate the control system 125 determines whether the remaining maintenance time of a processing chamber (e.g., the processing chamber that has the smallest remaining maintenance time) 113-119 is greater than or equal to the sum of (1) the time required by the ATM robot 109 to transport a substrate from a cassette 107 to one of the load lock chambers 103-105; (2) the time required to load the substrate into one of the load lock chambers 103-105; and (3) the time required by the vacuum robot 123 to transport the substrate from the respective load lock chamber 103-105 to the processing chamber 113-119.

If in step 303 it is determined that the electronic device manufacturing tool 101 may accommodate a substrate, the method 300 proceeds to step 304 wherein the substrate is received by the electronic device manufacturing tool 101; otherwise the method 300 proceeds to step 305 wherein the substrate is prevented from entering the electronic device manufacturing tool 101. Following either steps 304 or 305, the method 300 ends in step 306.

Third Exemplary System for Enhancing Electronic Device Manufacturing Throughput

Figure 4A:
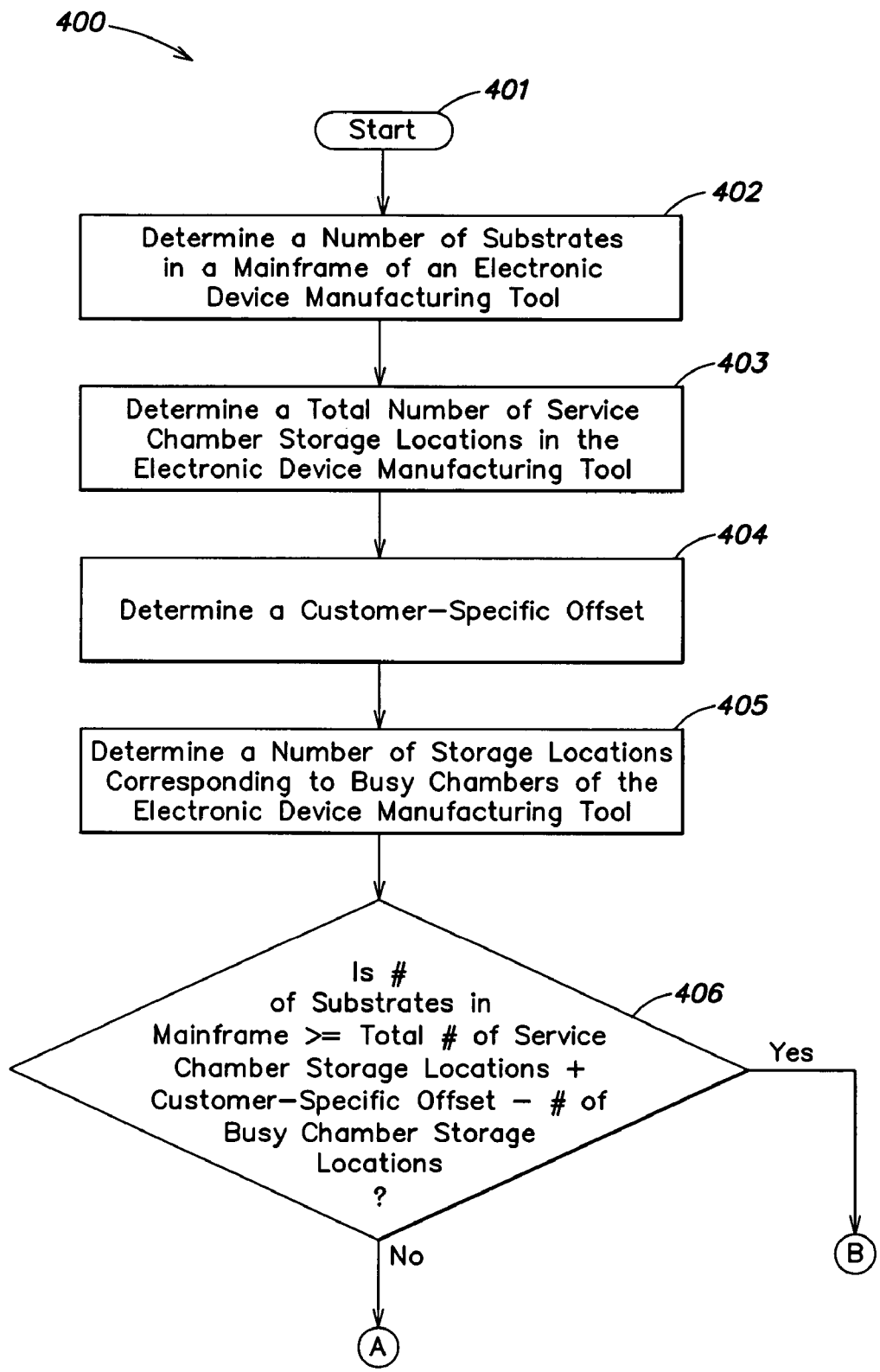
FIGS. 4A-B illustrate a third exemplary method for enhancing electronic device manufacturing throughput in accordance with an embodiment of the invention.
Figure 4B:
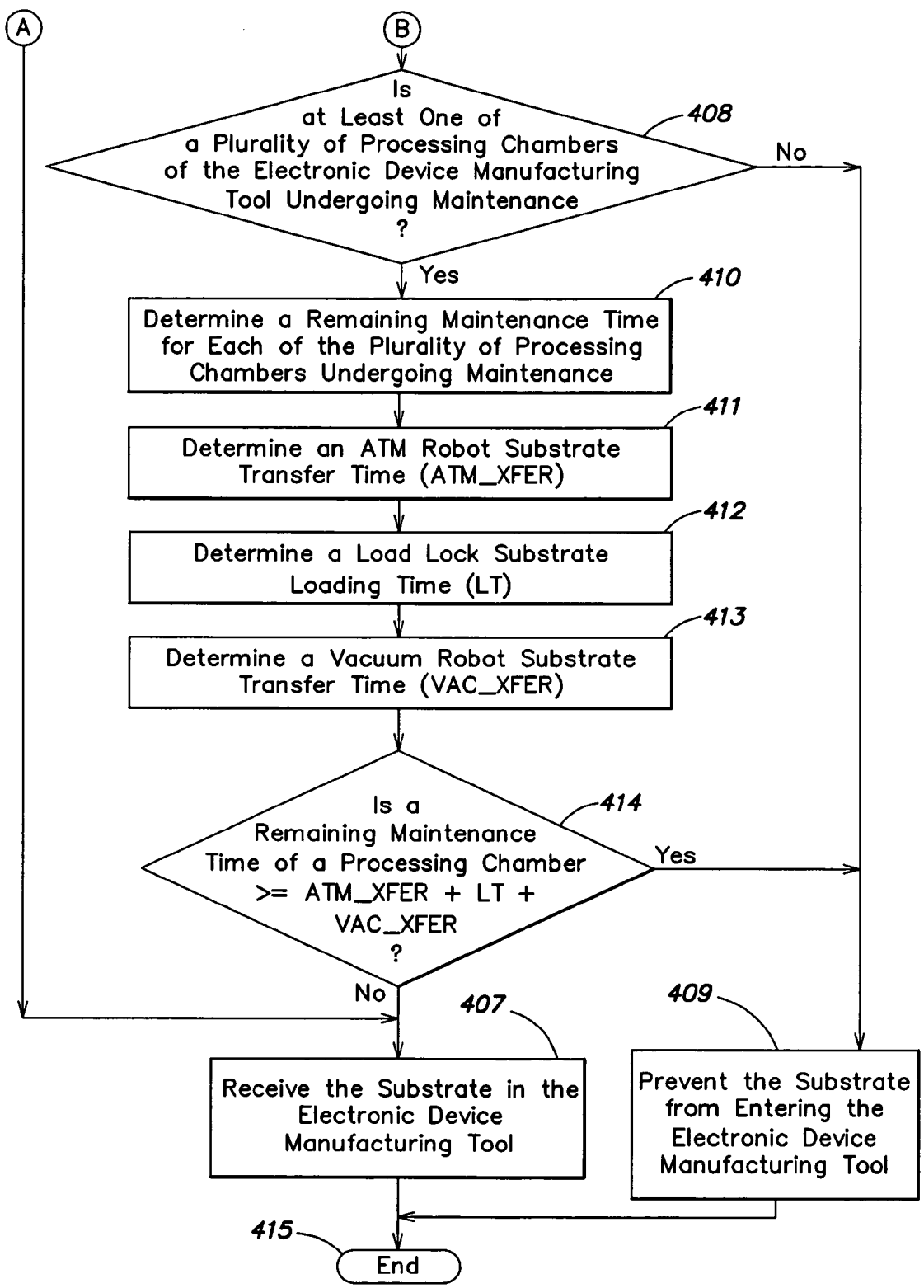

FIGS. 4A-B are flowcharts of a third exemplary method 400 for enhancing electronic device manufacturing throughput in accordance with an embodiment of the invention. One or more of the steps of method 400 may be implemented as one or more computer program products, and may be executed, for example, via the control system 125.

With reference to FIGS. 4A-B, the method 400 begins with step 401. In step 402, the number of substrates in a mainframe of an electronic device manufacturing tool is determined. As stated previously, the control system 125 monitors the status of chambers in the electronic device manufacturing tool 101 and determines the number of substrates in the mainframe of the electronic device manufacturing tool 101. For example, the control system 125 determines the number of substrates in the load locks 103-105, in processing chambers 113-119 and in the heating chamber 121 of the electronic device manufacturing tool 101.

In step 403, the total number of service chamber storage locations in the electronic device manufacturing tool 101 is determined. As stated, the control system 125 may be provided the above information (along with other initial information) during initial configuration of the electronic device manufacturing tool 101.

In step 404, a customer-specific offset is determined. The customer-specific offset refers to an offset that allows electronic device manufacturing software to adapt to a customer's electronic device manufacturing tool configuration. A number of substrates allowed in the customer's electronic device manufacturing tool may be based, in part, on the customer-specific offset. When the electronic device manufacturing tool 101 is initially configured, the customer-specific offset may be provided to the control system 125, for example, by a user.

In step 405, the number of storage locations corresponding to busy chambers of an electronic device manufacturing tool is determined. As stated above while describing step 202 of the method 200 of FIG. 2, the control system 125 makes the above-determination.

In step 406, the number of substrates in the mainframe of the electronic device manufacturing tool is compared to the total number of service chamber storage locations, the customer-specific offset (if any) and the number of storage locations corresponding to busy chambers. More specifically, the control system 125 determines whether the number of substrates in the mainframe of the electronic device manufacturing tool 101 is greater than or equal to the total number of service chamber storage locations plus the customer-specific offset (if any) minus the number of storage locations corresponding to busy chambers.

If in step 406 it is determined that the number of substrates in the mainframe of the electronic device manufacturing tool is not greater than or equal to the total number of service chamber storage locations plus the customer-specific offset (if any) minus the number of storage locations corresponding to busy chambers, the method 400 proceeds to step 407 wherein, as described above in step 204 of the method 200 of FIG. 2, the substrate is received by the electronic device manufacturing tool 101. Thereafter, the method 400 proceeds to step 415, in which the method 400 ends.

If, however, in step 406 it is determined that the number of substrates in the mainframe of the electronic device manufacturing tool is greater than or equal to the total number of service chamber storage locations plus the customer-specific offset (if any) minus the number of storage locations corresponding to busy chambers, the method proceeds to step 408. In step 408, it is determined whether at least one of a plurality of processing chambers of the electronic device manufacturing tool is undergoing maintenance. As stated, the control system 125 may determine whether any of the processing chambers 113-115 are undergoing maintenance, such as a periodic cleaning, as well as the time remaining for such maintenance.

If in step 408, it is determined that at least one of a plurality of processing chambers 113-119 of the electronic device manufacturing tool 101 is not undergoing maintenance, the method 400 proceeds to step 409, wherein, as described above in step 205 of the method 200 of FIG. 2, the substrate is prevented from entering the electronic device manufacturing tool 101. Thereafter, the method 400 proceeds to step 415, in which the method 400 ends.

If, however, in step 408 it is determined that at least one of a plurality of processing chambers of the electronic device manufacturing tool is undergoing maintenance, the method 400 proceeds to step 410. In step 410, a remaining maintenance time is determined for each of the plurality of processing chambers of the electronic device manufacturing tool undergoing maintenance. As stated above while describing step 302 of the method 300 of FIG. 3, the control system 125 may determine whether any of the processing chambers 113-115 are undergoing maintenance, such as a periodic cleaning, as well as the time remaining for such maintenance.

In step 411, an atmospheric (ATM) robot substrate transfer time (ATM_XFER) is determined. More specifically, the time required by the ATM robot 109 to transport a substrate from a cassette 107 to one of the load lock chambers 103-105 is determined. Such information is based on the electronic device manufacturing tool configuration and may be provided to, and therefore, determined by the control system 125 when the electronic device manufacturing tool 101 is initially configured.

In step 412, a load lock chamber substrate loading time (LT) is determined. More specifically, the time required to load the substrate into one of the load lock chambers 103-105 is determined. As stated, the load lock chamber substrate loading time includes the time required to pump and/or vent the load lock chamber to a desired pressure. Similar to the ATM robot substrate transfer time, load lock chamber substrate loading time is based on the electronic device manufacturing tool configuration and may be provided to, and therefore, determined by the control system 125 when the electronic device manufacturing tool is initially configured.

In step 413, a vacuum robot substrate transfer time (VAC_XFER) is determined. More specifically, the time required by the vacuum robot 123 to transport the substrate from the respective load lock chamber 103-105 to the processing chamber 113-119 is determined. Similar to the ATM robot substrate transfer time and the load lock chamber substrate loading time, the vacuum robot substrate transfer time is based on the electronic device manufacturing tool configuration and may be provided to, and therefore, determined by the control system 125 when the electronic device manufacturing tool 101 is initially configured.

In step 414, a remaining maintenance time of a processing chamber is compared to the ATM robot substrate transfer time, load lock chamber substrate loading time and vacuum robot substrate transfer time. For example, it is determined whether the remaining maintenance time of one of the plurality of processing chambers 113-119 of the electronic device manufacturing tool 101 undergoing maintenance is greater than or equal to the sum of the ATM robot substrate transfer time, load lock chamber substrate loading time and vacuum robot substrate transfer time. The control system 125, for example, may make the above determination. In one embodiment, the remaining maintenance time of one of the plurality of processing chambers 113-119 of the electronic device manufacturing tool 101 undergoing maintenance is the smallest (e.g., minimum) remaining maintenance time of the remaining maintenance times determined in step 410. In this manner, the control system 125 may determine a minimum amount of time in which a chamber (e.g., processing chamber 113-119) of the electronic device manufacturing tool 101 will be available to receive another substrate. However, in other embodiments, another remaining maintenance time may be employed.

If in step 414, it is determined that the remaining maintenance time of one of the plurality of processing chambers of the electronic device manufacturing tool undergoing maintenance is not greater than or equal to the sum of the ATM robot substrate transfer time, load lock chamber substrate loading time and vacuum robot substrate transfer time, the method 400 proceeds to step 407 in which, as described above, the substrate is received by the electronic device manufacturing tool 101, and thereafter, the method 400 proceeds to step 415, in which the method 400 ends. More specifically, because the remaining maintenance time of one of the plurality of processing chambers 113-119 (e.g., the processing chamber with the smallest remaining maintenance time) is not greater than or equal to the time to transport the substrate from the cassette 107 to one of the plurality of processing chambers 113-119 (e.g., to the processing chamber 113-119 with the smallest remaining maintenance time) of the electronic device manufacturing tool 101, maintenance of the one of the plurality of processing chambers 113-119 (e.g., the processing chamber 113-119 with the smallest remaining cleaning time) will complete while the substrate is transferred from the cassette 107 to such processing chamber 113-119. Consequently, the processing chamber 113-119 will be available to receive the substrate. Therefore, the control system 125 allows the electronic device manufacturing tool 101 to receive the substrate. In this manner, an overall wait time of the substrate, and therefore, the electronic device manufacturing tool 101 is reduced.

If, however, in step 414 it is determined that the remaining maintenance time of one of the plurality of processing chambers 113-119 of the electronic device manufacturing tool 101 undergoing maintenance is greater than or equal to the sum of the ATM robot substrate transfer time, load lock chamber substrate loading time and vacuum robot substrate transfer time, the method 400 proceeds to step 409 in which, as described above, the substrate is prevented from entering the electronic device manufacturing tool 101, and thereafter, the method 400 proceeds to step 415, in which the method 400 ends. More specifically, because the remaining maintenance time of one of the plurality of processing chambers 113-119 (e.g., the processing chamber with the smallest remaining maintenance time) is greater than or equal to the time to transport the substrate from the cassette 107 to one of the plurality of processing chambers 113-119 (e.g., the processing chamber 113-119 with the smallest remaining maintenance time) of the electronic device manufacturing tool 101, even if the electronic device manufacturing tool 101 receives and transports the substrate to such processing chamber 113-119, the processing chamber 113 will be undergoing cleaning when the substrate arrives. Therefore, the control system 125 prevents the substrate from entering the electronic device manufacturing tool 101.

Through use of the present methods and apparatus, the exemplary electronic device manufacturing tool 101 avoids disadvantages of conventional electronic device manufacturing tools, such as bottlenecks (e.g., jams) and/or deadlocks, thereby enhancing electronic device manufacturing throughput. Further, a maximum number (e.g., limit) of substrates that may be received by an electronic device manufacturing tool during electronic device manufacturing may be dynamically adjusted (e.g., in response to a change in status of the electronic device manufacturing tool).

The foregoing description discloses only exemplary embodiments of the invention. Modifications of the above disclosed apparatus and methods which fall within the scope of the invention will be readily apparent to those of ordinary skill in the art. For instance, in one or more embodiments (e.g., embodiments in which the vacuum robot includes a plurality of vacuum robot arms), the control system 125 may consider a number of available vacuum robot arms when determining whether one of the chambers (e.g., processing chambers) of the electronic device manufacturing tool may accommodate the substrate. In a further embodiment, when a determination is made that a remaining chamber busy time exceeds the time required to load and transfer a substrate to that chamber, the substrate load may be automatically set to occur at a time when the remaining chamber busy time equals the time required to load and transfer a substrate to that chamber.

Accordingly, while the present invention has been disclosed in connection with exemplary embodiments thereof, it should be understood that other embodiments may fall within the spirit and scope of the invention, as defined by the following claims.

The invention claimed is:

1. A method of enhancing electronic device manufacturing throughput, comprising:
   determining a number of storage locations corresponding to busy chambers of an electronic device manufacturing tool;
   based on the number of storage locations corresponding to busy chambers, determining whether the electronic device manufacturing tool may accommodate a substrate;
   if the electronic device manufacturing tool may accommodate the substrate, receiving the substrate in the electronic device manufacturing tool, wherein determining whether the electronic device manufacturing tool may accommodate the substrate includes determining whether at least one of a plurality of processing chambers of the electronic device manufacturing tool is undergoing maintenance;
   if at least one of the plurality of processing chambers is undergoing maintenance:
   determining a remaining maintenance time for each of the plurality of processing chambers undergoing maintenance; and
   determining the processing chamber having the smallest of the remaining maintenance times; and
   wherein determining whether the electronic device manufacturing tool may accommodate the substrate further includes:
   determining whether the smallest of the remaining maintenance times is greater than or equal to a time to transport the substrate from a cassette to the processing chamber of the electronic device manufacturing tool having the smallest of the remaining maintenance times; and
   if the smallest of the remaining maintenance times is greater than or equal to the time to transport the substrate from the cassette to one of the plurality of processing chambers of the electronic device manufacturing tool, determining the electronic device manufacturing tool may not accommodate the substrate; and
   if the smallest of the remaining cleaning times is less than the time to transport the substrate from the cassette to one of the plurality of processing chambers of the electronic device manufacturing tool, determining one of the plurality of processing chambers of the electronic device manufacturing tool may accommodate the substrate.

2. The method of claim 1 further comprising, if the electronic device manufacturing tool may not accommodate the substrate, preventing the substrate from entering the electronic device manufacturing tool.

3. The method of claim 1 wherein determining whether the electronic device manufacturing tool may accommodate the substrate includes determining whether a number of substrates in a mainframe of the electronic device manufacturing tool is greater than or equal to a sum of a total number of service chamber storage locations in the electronic device manufacturing tool and a customer-specific offset minus the number of storage locations corresponding to busy chambers.

4. The method of claim 1 further comprising, if none of the plurality of processing chambers are undergoing maintenance, preventing the substrate from entering the electronic device manufacturing tool.

5. The method of claim 1 wherein the time to transport the substrate from the cassette to one of the plurality of processing chambers of the electronic device manufacturing tool is based on the sum of a time required by an atmospheric (ATM) robot of the electronic device manufacturing tool to transport the substrate, a time required to load the substrate into a load lock chamber of the electronic device manufacturing tool and a time required by a vacuum robot of the electronic device manufacturing tool to transport the substrate.

6. The method of claim 1 wherein determining whether the smallest of the remaining maintenance times is greater than or equal to the time to transport the substrate from the cassette to one of the plurality of processing chambers of the electronic device manufacturing tool includes determining whether the smallest of the remaining maintenance times is greater than or equal to a time to transport the substrate from the cassette to the processing chamber having the smallest remaining maintenance time.

7. A method of enhancing electronic device manufacturing throughput, comprising:
   determining a remaining maintenance time for each of a plurality of processing chambers of an electronic device manufacturing tool that is undergoing maintenance;

based on a remaining maintenance time of one of the plurality of processing chambers, determining whether the electronic device manufacturing tool may accommodate a substrate;

determining whether the remaining maintenance time of the one of the plurality of processing chambers is greater than or equal to a time to transport the substrate from a cassette to one of the plurality of processing chambers of the electronic device manufacturing tool;

if the remaining maintenance time of the one of the plurality of processing chambers is less than the time to transport the substrate from the cassette to the one of the plurality of processing chambers, determining one of the plurality of processing chambers of the electronic device manufacturing tool may accommodate the substrate;

if the remaining maintenance time of the one of the plurality of processing chambers is greater than or equal to the time to transport the substrate from the cassette to the one of the plurality of processing chambers, determining the electronic device manufacturing tool may not accommodate the substrate; and if the electronic device manufacturing tool may accommodate the substrate, receiving the substrate in the electronic device manufacturing tool.

8. The method of claim 7 further comprising, if the electronic device manufacturing tool may not accommodate the substrate, preventing the substrate from entering the electronic device manufacturing tool.

9. The method of claim 7 wherein the remaining maintenance time of one of the plurality of processing chambers is the smallest of the remaining maintenance times.

10. The method of claim 7 wherein the time to transport the substrate from the cassette to the one of the plurality of processing chambers of the electronic device manufacturing tool is based on the sum of a time required by an atmospheric (ATM) robot of the electronic device manufacturing tool to transport the substrate, a time required to load the substrate into a load lock chamber of the electronic device manufacturing tool and a time required by a vacuum robot of the electronic device manufacturing tool to transport the substrate.

11. The method of claim 7 wherein determining whether the remaining maintenance time of the one of the plurality of processing chambers is greater than or equal to the time to transport the substrate from the cassette to the one of the plurality of processing chambers of the electronic device manufacturing tool includes determining whether the remaining maintenance time of the one of the plurality of processing chambers is greater than or equal to a time to transport the substrate from the cassette to the processing chamber with the smallest remaining maintenance time.

12. A method of enhancing electronic device manufacturing throughput, comprising:

determining a number of storage locations corresponding to busy chambers of an electronic device manufacturing tool;

determining a remaining maintenance time for each of a plurality of processing chambers of the electronic device manufacturing tool that is undergoing maintenance;

based on the number of storage locations corresponding to busy chambers and a remaining maintenance time of one of the plurality of processing chambers, determining whether the electronic device manufacturing tool may accommodate a substrate;

determining whether a remaining maintenance time of one of the plurality of processing chambers is greater than or equal to a time to transport the substrate from a cassette to the one of the plurality of processing chambers of the electronic device manufacturing tool; and if the remaining maintenance time of the one of the plurality of processing chambers is less than the time to transport the substrate from the cassette to the one of the plurality of processing chambers, determining the one of the plurality of processing chambers of the electronic device manufacturing tool may accommodate the substrate;

if the remaining maintenance time of the one of the plurality of processing chambers is greater than or equal to the time to transport a substrate from the cassette to the one of the plurality of processing chambers of the electronic device manufacturing tool, determining the electronic device manufacturing tool may not accommodate a substrate; and if the electronic device manufacturing tool may accommodate a substrate, receiving a substrate in the electronic device manufacturing tool.

13. The method of claim 12 further comprising, if the electronic device manufacturing tool may not accommodate a substrate, preventing a substrate from entering the electronic device manufacturing tool.

14. The method of claim 12 wherein determining whether the electronic device manufacturing tool may accommodate a substrate includes determining whether a number of substrates in a mainframe of the electronic device manufacturing tool is greater than or equal to a sum of a total number of service chamber storage locations in the electronic device manufacturing tool and a customer-specific minus the number of storage locations corresponding to busy chambers.

15. The method of claim 12 wherein the remaining maintenance time of the one of the plurality of processing chambers is the smallest of the remaining maintenance times.

16. The method of claim 12 wherein the time to transport a substrate from the cassette to the one of the plurality of processing chambers of the electronic device manufacturing tool is based on the sum of a time required by an atmospheric (ATM) robot of the electronic device manufacturing tool to transport a substrate, a time required to load a substrate into a load lock chamber of the electronic device manufacturing tool and a time required by a vacuum robot of the electronic device manufacturing tool to transport a substrate.

17. The method of claim 12 wherein determining whether the remaining maintenance time of the one of the plurality of processing chambers is greater than or equal to the time to transport a substrate from the cassette to the one of the plurality of processing chambers of the electronic device manufacturing tool includes determining whether the remaining maintenance time of the one of the plurality of processing chambers is greater than or equal to a time to transport a substrate from the cassette to a processing chamber with the smallest remaining maintenance time.

18. An electronic device manufacturing tool comprising:

a control system adapted to couple to one or more of a plurality of processing chambers, a service chamber, an atmospheric robot, a vacuum robot and a load lock chamber of the electronic device manufacturing tool, and further adapted to:

compare a remaining maintenance time of a processing chamber with a transport time, wherein the transport time is a time required to transport a substrate from a cassette to the processing chamber;

determine a number of storage locations corresponding to busy chambers of the electronic device manufacturing tool;

based on the number of storage locations corresponding to busy chambers, determine whether the electronic device manufacturing tool may accommodate a substrate;

if the electronic device manufacturing tool may accommodate the substrate, allow receipt of the substrate in the electronic device manufacturing tool, wherein determining whether the electronic device manufacturing tool may accommodate the substrate includes determining whether at least one of a plurality of processing chambers of the electronic device manufacturing tool is undergoing maintenance; and wherein the control system is further adapted to:
prevent the substrate from being transported to the processing chamber if the remaining maintenance time of the processing chamber is greater than the transport time; and allow the substrate to be transported to the processing chamber if the remaining maintenance time is less than the transport time.

19. The electronic device manufacturing tool of claim 18 wherein the control system is further adapted to, if the electronic device manufacturing tool may not accommodate the substrate, prevent the substrate from entering the electronic device manufacturing tool.

20. The electronic device manufacturing tool of claim 18 wherein the control system is further adapted to determine whether a number of substrates in a mainframe of the electronic device manufacturing tool is greater than or equal to a sum of a total number of service chamber storage locations in the electronic device manufacturing tool and a customer-specific offset minus the number of storage locations corresponding to busy chambers.

21. An electronic device manufacturing tool comprising:
a control system adapted to couple to one or more of a plurality of processing chambers, a service chamber, an atmospheric robot, a vacuum robot and a load lock chamber of the electronic device manufacturing tool, and further adapted to:

determine a remaining maintenance time for each of the plurality of processing chambers of the electronic device manufacturing tool that is undergoing maintenance;

based on a remaining maintenance time of one of the plurality of processing chambers, determine whether the electronic device manufacturing tool may accommodate a substrate; wherein the control system is further adapted to:

determine whether a remaining maintenance time of one of the plurality of processing chambers is greater than or equal to a time to transport the substrate from a cassette to the one of the plurality of processing chambers of the electronic device manufacturing tool; and if the remaining maintenance time of the one of the plurality of processing chambers is less than the time to transport the substrate from the cassette to the one of the plurality of processing chambers, the control system is adapted to determine that the one of the plurality of processing chambers of the electronic device manufacturing tool may accommodate the substrate;

if the remaining maintenance time of the one of the plurality of processing chambers is greater than or equal to the time to transport a substrate from the cassette to the one of the plurality of processing chambers of the electronic device manufacturing tool, the control system is adapted to determine the electronic device manufacturing tool may not accommodate a substrate; and if the electronic device manufacturing tool may accommodate a substrate, allow receipt of the substrate in the electronic device manufacturing tool.

22. The electronic device manufacturing tool of claim 21 wherein the control system is further adapted to, if the electronic device manufacturing tool may not accommodate a substrate, prevent the substrate from entering the electronic device manufacturing tool.

23. An electronic device manufacturing tool comprising:
a control system adapted to couple to one or more of a plurality of processing chambers, a service chamber, an atmospheric robot, a vacuum robot and a load lock chamber of the electronic device manufacturing tool, and further adapted to:

determine a number of storage locations corresponding to busy chambers of the electronic device manufacturing tool;

determine a remaining maintenance time for each of the plurality of processing chambers of the electronic device manufacturing tool that is undergoing maintenance;

based on the number of storage locations corresponding to busy chambers and a remaining maintenance time of one of the plurality of processing chambers, determine whether the electronic device manufacturing tool may accommodate a substrate; wherein the control system is further adapted to:

determine whether a remaining maintenance time of one of the plurality of processing chambers is greater than or equal to a time to transport the substrate from a cassette to the one of the plurality of processing chambers of the electronic device manufacturing tool; and if the remaining maintenance time of the one of the plurality of processing chambers is less than the time to transport the substrate from the cassette to the one of the plurality of processing chambers, the control system is adapted to determine that the one of the plurality of processing chambers of the electronic device manufacturing tool may accommodate the substrate;

if the remaining maintenance time of the one of the plurality of processing chambers is greater than or equal to the time to transport a substrate from the cassette to the one of the plurality of processing chambers of the electronic device manufacturing tool, the control system is adapted to determine the electronic device manufacturing tool may not accommodate a substrate; and if the electronic device manufacturing tool may accommodate a substrate, allow receipt of the substrate in the electronic device manufacturing tool.

24. The electronic device manufacturing tool of claim 23 wherein the control system is further adapted to, if the electronic device manufacturing tool may not accommodate the substrate, prevent the substrate from entering the electronic device manufacturing tool.

25. A method of enhancing electronic device manufacturing tool throughput, comprising:
providing a processing chamber, where the processing chamber is undergoing maintenance;

determining a remaining maintenance time of the processing chamber;

determining a transport time, wherein the transport time is a time required to transport a substrate from a cassette to the processing chamber;

comparing the remaining maintenance time to the transport time; and one of:
  determining that the transport time is greater than the remaining maintenance time and then receiving the substrate in the electronic device manufacturing tool; or
  determining that the transport time is less than the remaining maintenance time and then not receiving the substrate in the electronic device manufacturing tool.

26. The method of claim 25 wherein the transport time includes the sum of:
  a time required by an atmospheric robot to transport the substrate from a cassette to a load lock chamber;
  a time required to seal the load lock chamber, reduce a pressure within the load lock chamber to a predetermined pressure and open a door between the load lock chamber and a transfer chamber; and
  a time required by a vacuum robot to unload the substrate from the load lock chamber and deliver the substrate to the processing chamber.

27. The method of claim 25 wherein receiving the substrate in the electronic device manufacturing tool includes transporting the substrate to the processing chamber.

* * * * *